(12) United States Patent
Wiener

(10) Patent No.: US 7,088,527 B2
(45) Date of Patent: Aug. 8, 2006

(54) UNIFORMITY CORRECTION SYSTEM HAVING LIGHT LEAK AND SHADOW COMPENSATION

(75) Inventor: Roberto B. Wiener, Bethel, CT (US)

(73) Assignee: ASML Holding N.V., De Veldhoven (NL)

( * ) Notice: Subject to any disclaimer, the term of this patent is extended or adjusted under 35 U.S.C. 154(b) by 0 days.

(21) Appl. No.: 11/022,837

(22) Filed: Dec. 28, 2004

(65) Prior Publication Data

US 2006/0139769 A1 Jun. 29, 2006

(51) Int. Cl.
- *G02B 9/00* (2006.01)
- *G02B 9/08* (2006.01)
- *G03B 27/54* (2006.01)

(52) U.S. Cl. .................... 359/738; 355/67
(58) Field of Classification Search ........ 359/738–739, 359/613–614; 355/53, 67, 71
See application file for complete search history.

(56) References Cited

U.S. PATENT DOCUMENTS 6,741,329 B1 * 5/2004 Leenders et al. ............ 355/71
2005/0140957 A1 * 6/2005 Luijkx et al. ................ 355/71

* cited by examiner

*Primary Examiner*—Alicia M Harrington
(74) *Attorney, Agent, or Firm*—Sterne Kessler Goldstein Fox PLLC

(57) ABSTRACT

A system and method for uniformity correction having light leak and shadow compensation is provided. The system includes multiple correction elements and an optical compensation plate. Adjacent correction elements are separated by a gap. The optical compensation plate includes a pattern having multiple gap compensation segments. The pattern has an attenuation which is different than the attenuation of the remaining portions of the optical compensation plate. The location of each compensation segment on the compensation plate corresponds to the location of the corresponding gap between adjacent correction elements in the illumination slot. The width of each compensation segment is dependent upon the angle of the light incident on the correction system. The pattern can be located on the top surface or on the bottom surface of the compensation plate. In addition, the compensation plate can be located above or below the plurality of correction elements.

20 Claims, 8 Drawing Sheets

UNIFORMITY CORRECTION SYSTEM HAVING LIGHT LEAK AND SHADOW COMPENSATION

FIELD OF THE INVENTION

The present invention is generally related to uniformity correction in lithography systems.

BACKGROUND OF THE INVENTION

Conventional lithography systems include, among other things, an illumination system to produce a uniform intensity distribution of a received laser beam. It is desirable that the resulting illumination be as uniform as possible and that any uniformity errors be kept as small as possible. Illumination uniformity influences the ability of an illumination system to produce uniform line widths across an entire exposure field. Illumination uniformity errors can significantly impact the quality of devices produced by the lithography system.

Techniques for correcting uniformity include correction systems that have multiple correction elements such as plates inserted from opposites of an illumination slot. These correction elements have non-zero attenuation (e.g., 90%). However, due to various constraints, a gap exists between adjacent correction elements. The gaps between adjacent correction elements generate unwanted optical effects such as gap ripples and shadows. Because each gap has a 0% attenuation (or 100% transmission) and the correction elements have non-zero attenuation, light through the gaps generate streaks or bands of greater intensity on the substrate. The bands of greater intensity impact the width of lines in the exposure field. Furthermore, each correction element has a finite thickness. Thus, each correction elements has a plurality of edges. If light is coming in on an angle (i.e., larger sigma), part of the light reflects off the edge, casting a shadow on the substrate.

Therefore, what is needed is a uniformity correction system that compensates for optical effects created by gaps between adjacent correction elements, that provides increased uniformity across the slot, and that improves critical dimensions.

SUMMARY OF THE INVENTION

The present invention is directed to a system and method for uniformity correction having light leak and shadow compensation. In accordance with an aspect of the present invention, the system for uniformity correction includes a plurality of correction elements and an optical compensation plate. In an embodiment, the correction elements are moveable within an illumination slot. Adjacent correction elements are separated by a gap. The optical compensation plate includes a pattern having multiple gap compensation segments. The pattern has an attenuation which is different than the attenuation of the remaining portions of the optical compensation plate.

Each gap compensation segment corresponds to one of the gaps between adjacent correction elements. The location of each gap compensation segment on the optical compensation plate substantially corresponds to the location of the corresponding gap between adjacent correction elements in the illumination slot. The width of each gap compensation segment is dependent upon the angle of the light incident on the correction system. In aspect of the invention, the width of each gap compensation segment is larger than the width of the corresponding gap. A gap compensation segment can have any length. In an aspect of the invention, a gap compensation segment extends from a first edge of the optical compensation plate to a second edge of the optical compensation plate.

In an aspect of the invention, the pattern is on the top (or upper) surface of the optical compensation plate. In an alternate aspect of the invention, the pattern is on the bottom (or lower) surface of the optical compensation plate. The pattern can be formed from any material having an attenuation.

In an aspect of the invention, the optical compensation plate is located above the plurality of correction elements. In an alternate aspect of the invention, the optical compensation plate is located below the plurality of correction elements.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 1 illustrates an exemplary lithography system having uniformity correction, according to an embodiment of the present invention.

FIGS. 2A–D depict high level block diagrams of exemplary uniformity correction systems, according to embodiments of the present invention.

FIG. 3 depicts optical effects created by the gaps between adjacent correction elements.

FIG. 4 further illustrates the cause of gap ripple.

FIGS. 5A–C depict a correction system having a chevron configuration and an exemplary optical compensation plate, according to an embodiment of the present invention.

Figure 1:
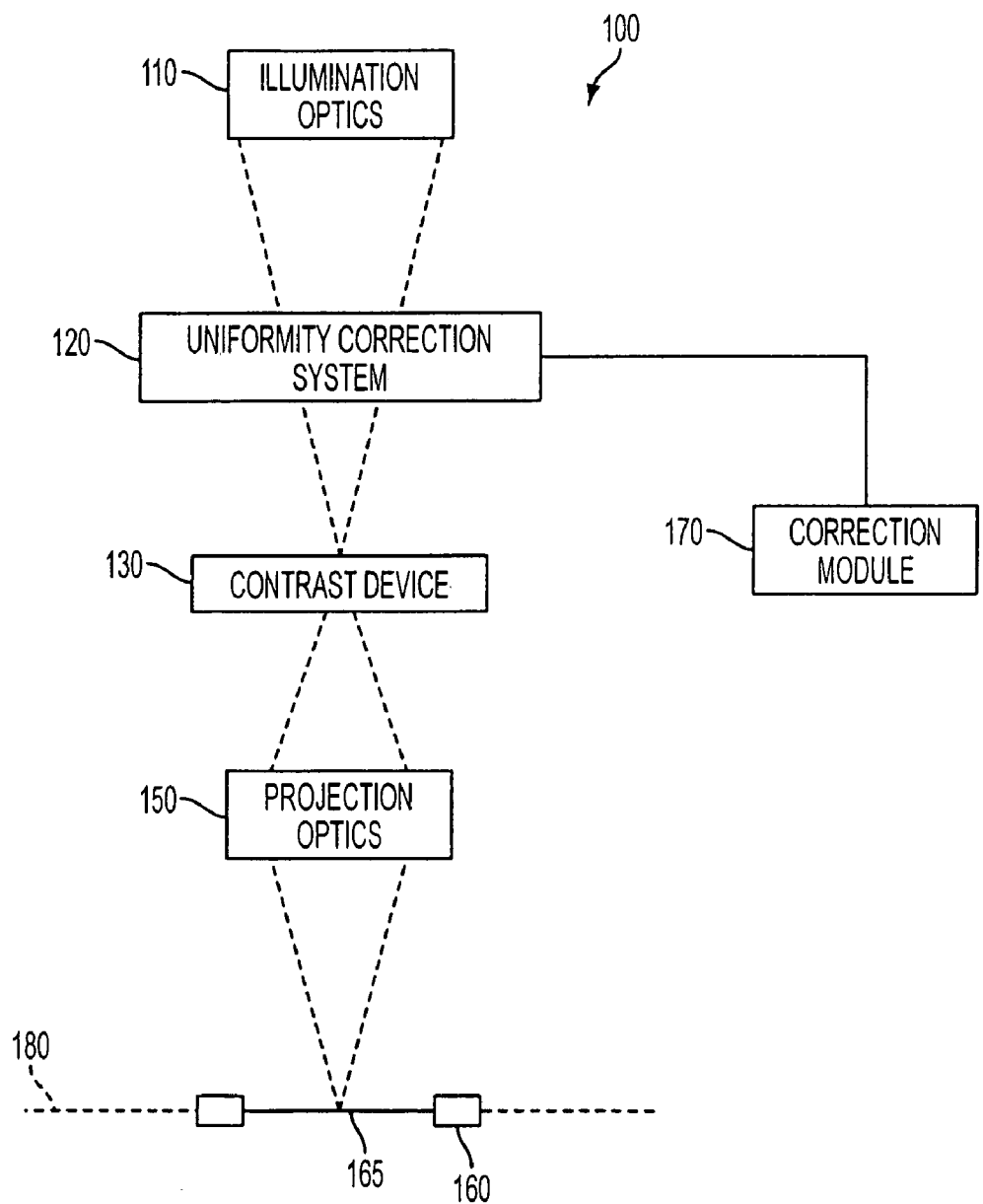

The present invention will now be described with reference to the accompanying drawings. In the drawings, like reference numbers can indicate identical or functionally similar elements. Additionally, the left-most digit(s) of a reference number may identify the drawing in which the reference number first appears.

DETAILED DESCRIPTION OF THE INVENTION

FIG. 1 is an illustration of an exemplary lithography system 100, according to an embodiment of the invention. In an embodiment, lithography system 100 is a system using a reticle or mask. In an alternate embodiment, system 100 is a maskless lithography system.

Lithography system 100 includes an illumination system 110, a uniformity correction system 120, a contrast device 130, projection optics 150, a substrate stage 160, and a correction module 170.

Illumination system 110 illuminates contrast device 130. Illumination system 110 may use any type of illumination (e.g., quadrapole, annular, etc.) as required by the lithography system. In addition, illumination system 110 may support the modification of various illumination properties such as partial coherence or fill geometry. The details of illumination systems are well known to those skilled in the art and thus are not explained further herein.

Contrast device 130 is used to image a pattern onto a portion of a substrate 165 (e.g., wafer or glass plate) held by substrate stage 160. In a first embodiment, contrast device 135 is a static mask such as a reticle and substrate 165 is a wafer. In a second maskless embodiment, contrast device 130 is a programmable array. The programmable array may include a spatial light modulator (SLM) or some other suitable micro-mirror array. Alternatively, the SLM can comprise a reflective or transmissive liquid crystal display (LCD) or a grating light value (GLV). In the second embodiment, substrate 165 may be a piece of glass, flat panel display, or similar.

Projection optics 150 is configured to project an image of the pattern (defined by the contrast device) on the substrate. The details of projection optics 150 are dependent upon the type of lithography system used. Specific functional details of projection optics are well known to those skilled in the art and therefore are not explained further herein.

Substrate stage 160 is located at the image plane 180. Substrate stage 160 supports a substrate 165. In an embodiment, the substrate is a resist coated wafer. In an alternate embodiment, the substrate is a piece of glass, flat pane display or similar.

Uniformity correction system 120 is a device that controls illumination levels within specific sections of illumination fields associated with system 100. The uniformity correction system 120 is positioned between the illumination optics 110 and the contrast device stage 130 at the correction plane. In an embodiment, the correction plane is located proximate to the contrast device stage (e.g., reticle stage). In alternative embodiments, the correction plane can be located at any position between illumination optics 110 and contrast device stage 130.

FIGS. 2A–D depict high level block diagrams of exemplary uniformity correction systems 220. As depicted in FIGS. 2A through 2D, a uniformity correction system includes multiple correction elements 220a–n, optional multiple correction elements 222a–n, and a optical compensation plate 250. Multiple correction elements 220a–n and 222 a–n are inserted into the illumination slot in a defined configuration. Multiple correction elements 220, 222 can be any mechanisms that effect uniformity. In an embodiment, multiple correction elements 220a–n and 222a–n are plates (also referred to as fingers) constructed of a transmissive material. For example, in an embodiment, each finger has a 10% attenuation (i.e., 90% transmission). In an alternate embodiment, the fingers are opaque (i.e., 0% transmissibility). As would be appreciated by persons of skill in the art, other attenuation values could be used for the correction elements. In addition, the correction elements could have variable attenuation.

Figure 2A:
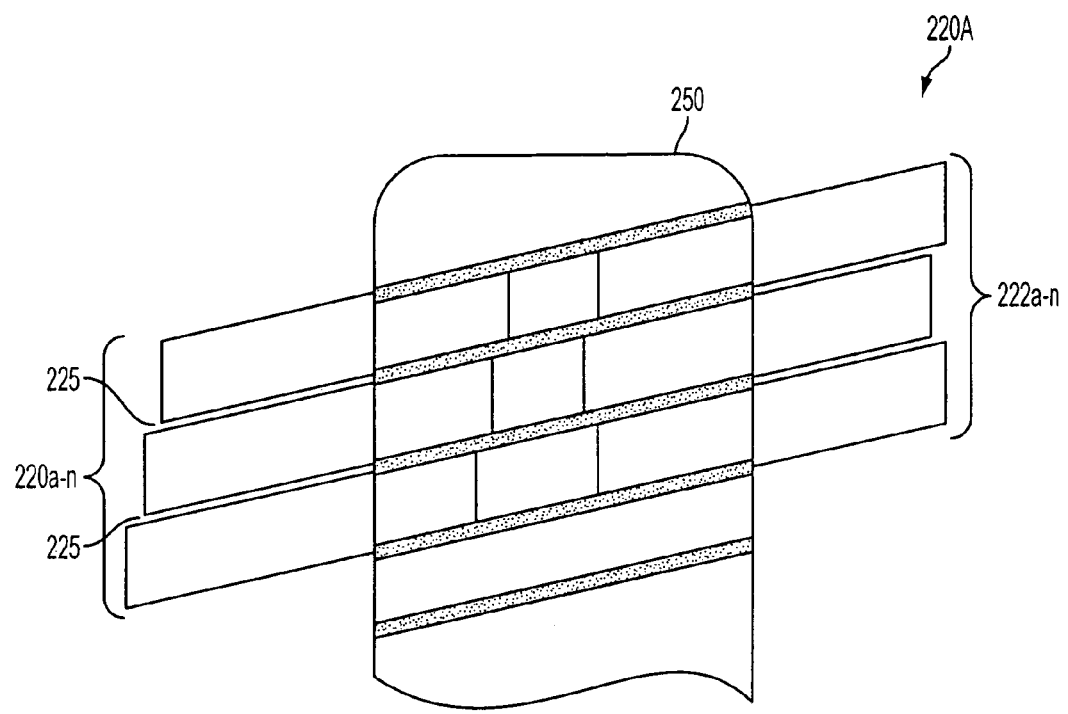

FIG. 2A is a top down view of correction system 220A. In correction system 220A, the multiple correction elements 220a–n and 222a–n have a tilted configuration. In this configuration, multiple correction elements 220a–n are inserted from a first side (e.g., the left side) of the illumination slot at an angle α with respect to the scan direction (or Y-axis). Multiple correction elements 222a–n are inserted from the opposite side (e.g., right side) of the illumination slot at an angle-α with respect to the scan direction (or Y-axis). In an embodiment, the maximum insertion of correction elements 220a–n and 222a–n is to a neutral point. That is, each correction element can be inserted any amount up to a point at which the tip of a correction element 220 is proximate to the tip of a correction element 222. In this embodiment, correction elements 220a–n do not overlap correction elements 222a–n.

As can be seen in FIG. 2A, in this configuration, each correction element 220a–n is opposed to its corresponding correction element 222a–n (e.g., correction element 220a is opposed to correction element 222a, correction element 220b is opposed to correction element 222b, etc.). Thus, each correction element 220a–n and its corresponding correction element 222a–n can be considered as being in the same correction slot. Although FIG. 2A only depicts four correction elements per side, any number of fingers per side could be used in the present invention.

Figure 2B:
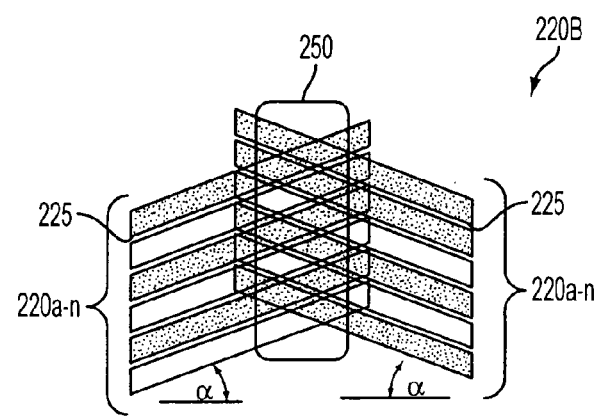

FIG. 2B is a top down view of correction system 220B. In correction system 220B, the multiple correction elements 220a–n and 222a–n have a chevron configuration. In this configuration, multiple correction elements 220a–n are inserted from a first side (e.g., the left side) of the illumination slot at an angle α with respect to the scan direction (or Y-axis). Multiple correction elements 222a–n are inserted from the opposite side (e.g., right side) of the illumination slot at the same angle, α, with respect to the scan direction (or Y-axis). In this configuration, correction elements 220 and 222 can be inserted to a depth such that correction elements 220 overlap correction elements 222. In this embodiment, each correction element can be inserted any amount up to a maximum insertion point.

Figure 2C:
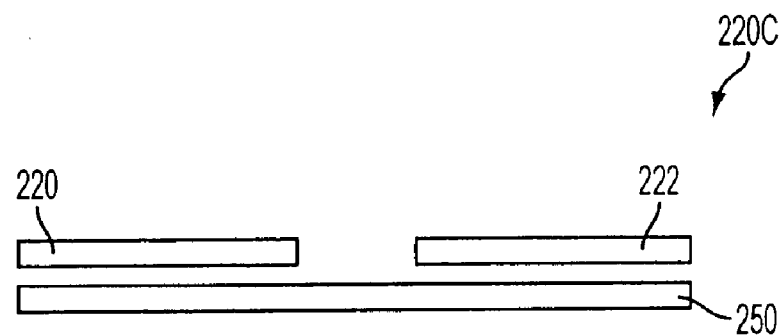

FIG. 2C is a high level block diagram of a side view of portion of correction system 220C. As shown in FIG. 2C, optical compensation plate 250 is parallel to the plane containing the multiple correction elements 220, 222. In an embodiment, the bottom surface of the correction elements are proximate to the upper surface of the optical compensation plate. The separation between the bottom surface of the correction elements and the upper surface of the optical compensation plate is less than 0.1 mm. As would be appreciated by a person of skill in the art, other separation distances could be used with the present invention.

Figure 2D:
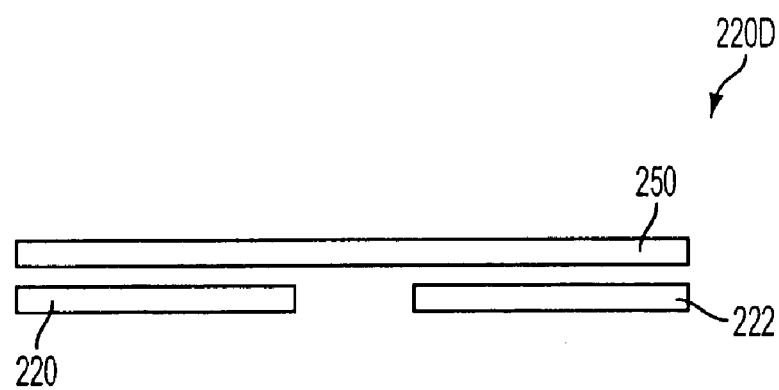

FIG. 2D a high level block diagram of a side view of portion of correction system 220D. In this embodiment, the bottom surface of the optical compensation plate is proximate to the upper surfaces of the multiple correction elements 220, 222. The separation between the bottom surface of the correction elements and the upper surface of the optical compensation plate is less than 0.1 mm. As would be appreciated by a person of skill in the art, other separation distances could be used with the present invention.

In an embodiment of the invention, optical compensation plate 250 has 0% attenuation (i.e., 100% transmission). As would be appreciated by a person of skill in the art, an optical compensation plate having other attenuation values could be used with the present invention.

As can be seen in FIGS. 2A through D, adjacent correction elements (e.g. 220a–n, 222a–n) are separated by a gap 225a–n. As would be appreciated by a person of skill in the art, adjacent fingers can be separated by any size gap, as required by the constraints of the compensation system. In an embodiment, each gap 225a–n are equal in size.

Figure 3:
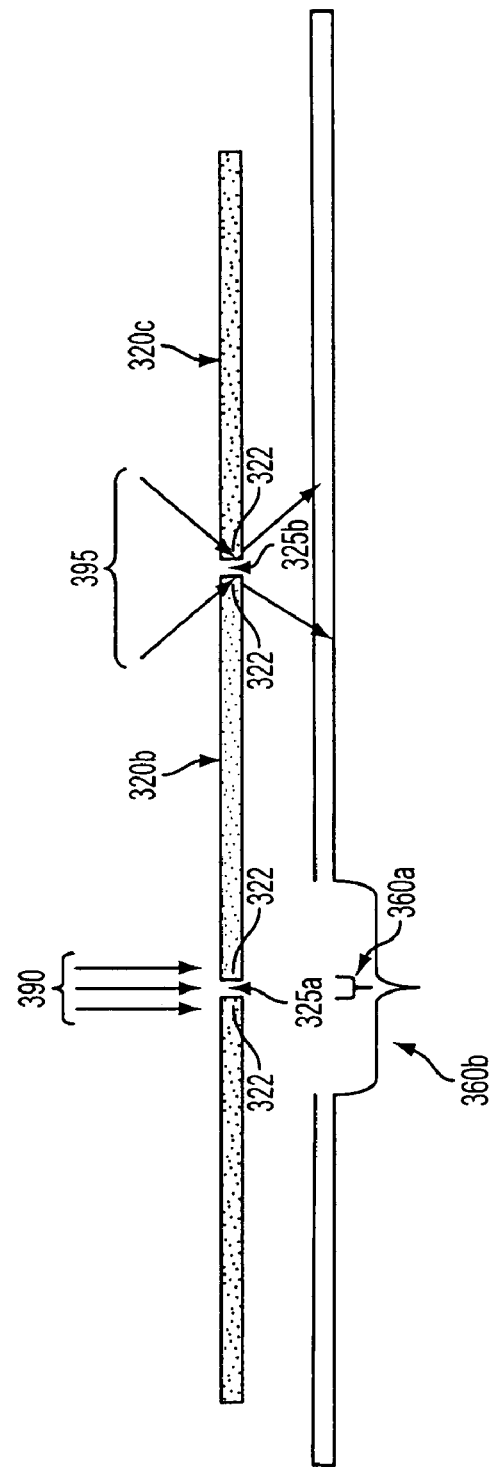

The gaps between adjacent correction elements generate unwanted optical effects such as gap ripples and shadows. An example of these effects is illustrated in FIG. 3. FIG. 3 depicts a portion of a correction system 330 having a plurality of adjacent correction elements 320a–c. Adjacent correction elements 320a–c are separated by gaps 325a,b. Because each gap has a 0% attenuation (or 100% transmission), light through the gaps generate streaks or bands of greater intensity on the substrate. The intensity of the streaks is dependent upon the angle of the incident light. For example, when the light beams are substantially parallel as shown by light 390 in FIG. 3 (i.e., the light has a small sigma), the maximum amount of light comes through the gap. When the light is spread through a variety of angles as shown by light 395 in FIG. 3 (i.e., light has a larger sigma), a portion of the light is reflected causing a decrease in the intensity of the streaks. As the angle increases (i.e., sigma increases), less light that gets through the gap further decreasing the intensity of the streaks. Area 360a is the area of greater intensity due to the gap when the incident light has the smallest sigma. Area 360b is the area of greater intensity due to the gap when the incident light has the largest sigma. As illustrated, area 360a is narrower than area 360b. However, light in area 360a has a greater intensity than light in area 360b.

As can be seen in FIG. 3, each correction element has a finite thickness. Thus, each correction elements has a plurality of edges 322. If light is coming in on an angle (i.e., larger sigma), part of the light reflects off the edge 322, casting a shadow on the substrate. When two correction elements 320b, c are adjacent and light is coming in on an angle from one side, a shadow is cast by the edge 322 of the first finger 320b and a second shadow is cast by the edge 322 of the second finger 320c. The shadow effect can be exacerbated by the illumination mode being used. For example, if dipole illumination is used, light is incident on the correction elements from a first direction and from a second direction opposite the first direction. Thus, the edges of adjacent fingers cause four shadows to be cast on the substrate in addition to the streak of greater intensity caused by the gap.

Figure 4:
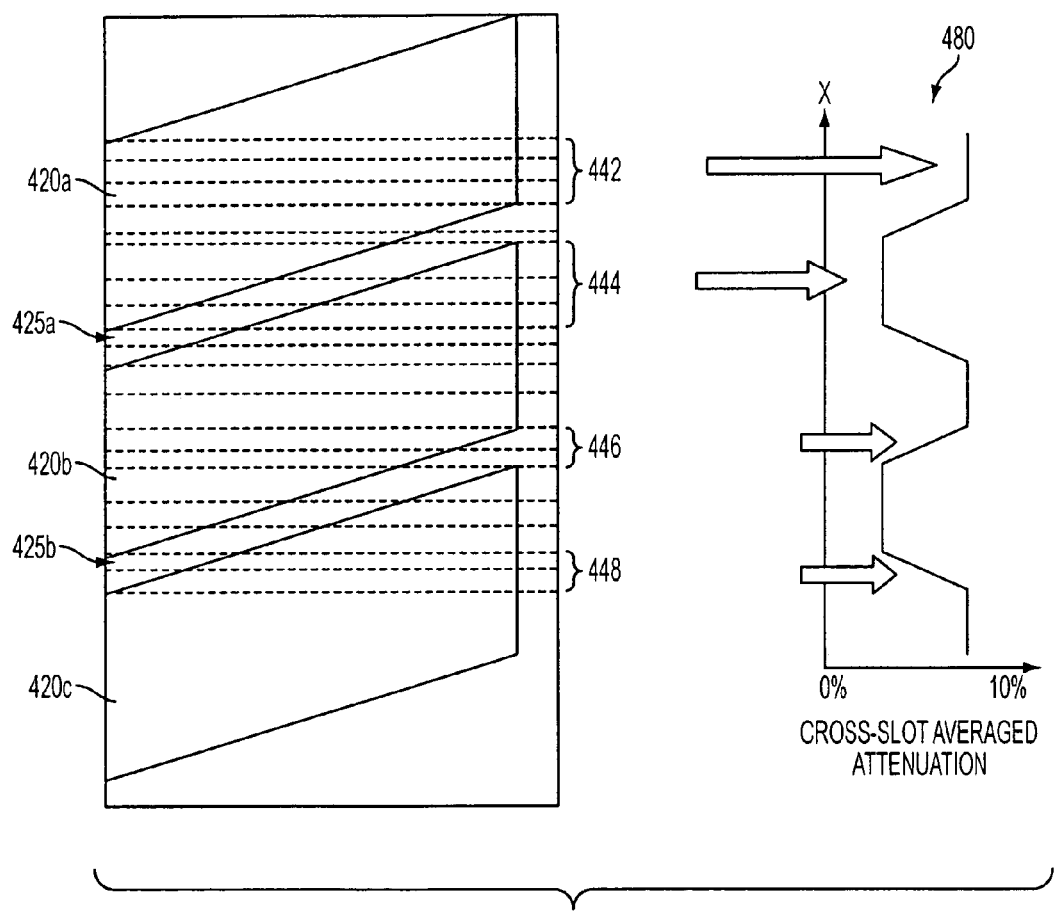

FIG. 4 further illustrates the cause of gap ripple. FIG. 4 depicts a portion 435 of an illumination slot having multiple adjacent correction elements 420a–c inserted from the left side. The adjacent correction elements 420a–c are separated by gaps 425a, b. FIG. 4 further depicts the cross-slot averaged attenuation 480 associated with the correction system.

As shown in FIG. 4, scan lines 442 do not enter or cross the gap region 425a. As a result, cross slot attenuation is normal (at approximately 8% attenuation). Scan lines 444 cross gap region 425a. As a result, more light comes through, increasing intensity and decreasing attenuation. Scan lines 446 enter gap region 425b but do not cross a gap region 425a or b. As a result, cross slot attenuation is variable. Scan lines 448 also enter gap region 425b but do not cross a gap region 425a or b. As a result, cross slot attenuation is variable. Thus, as can be seen in the plot of cross-slot averaged attenuation, an attenuation ripple is generated.

Figure 5C:
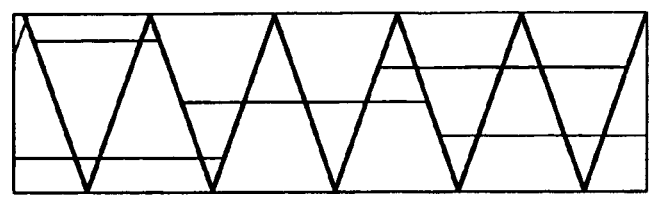
Figure 5B:
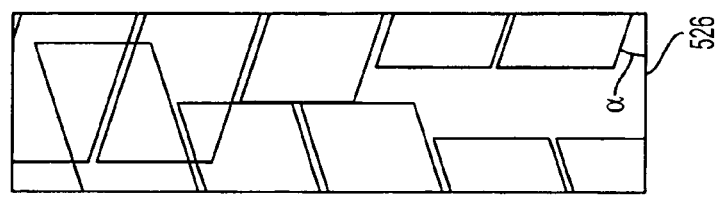
Figure 5A:
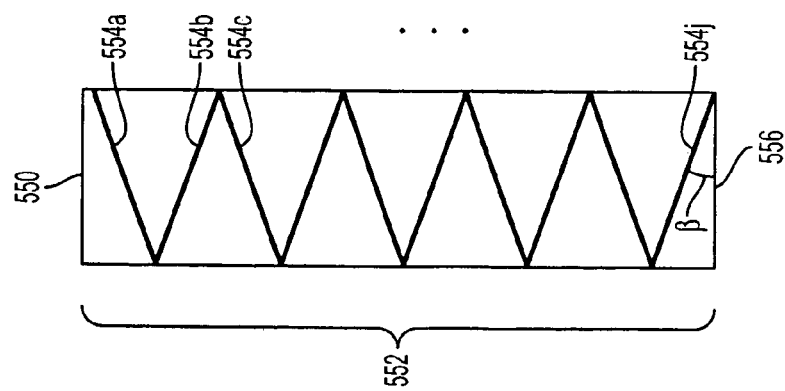

FIG. 5A depicts an exemplary optical compensation plate 550 for use with a correction system having a chevron configuration, according to an embodiment of the present invention. Optical compensation plate 550 includes a pattern 552 having a plurality of gap compensation segments 554a–j. The gap compensation segments 554a–j have a different attenuation than the remaining areas of optical compensation plate 550. For example, the gap compensation segments 554 may have an 3% attenuation (i.e., 97% transmission) while the remaining areas of the optical compensation plate 550 have a 0% attenuation (i.e., 100% transmission).

Optical compensation plate 550 has a first surface and a second surface. In an embodiment, pattern 552 is on the first surface. In an alternate embodiment, pattern 552 is on the second surface. In a further embodiment, pattern 552 is included within optical compensation plate.

Pattern 552 can be formed of any material having a non-zero attenuation. For example, pattern 552 may be a coating comprised of a series of dots. As would be appreciated by persons of skill in the art, pattern 552 can be coupled to optical compensation plate 550 by a variety of methods.

Each gap compensation segment 554a–j corresponds to a gap between adjacent correction elements. FIG. 5B depicts an exemplary chevron configuration of correction elements. The angle, β, 556 of the gap compensation segment 554a–j with respect to the bottom edge of the compensation plate is equal to the angle, α, 526 of its corresponding gap with respect to the Y-axis of the illumination slot. As can be seen in FIG. 5C, the location of each gap compensation segment 554 on the optical compensation plate 550 corresponds to the location of its corresponding gap in the illumination slot.

The width of each gap compensation segment 554 is dependent upon the angle of the incident light. For example, if the incident light has a small sigma, the gap compensation segment 554 can have a width equal to or slightly larger than the width of the gap between adjacent correction elements. If the incident light has a large sigma, the gap compensation segment has a greater width. In general, the width of each gap compensation segment 554 is greater than the width of the gap between adjacent correction elements.

The length of each gap compensation segment 554 is dependent on a variety of factors including the configuration of the correction elements and the maximum depth of insertion of each element. As can be seen in FIGS. 5A and 5C, the gap compensation segments extend across the optical compensation plate 550. As would be appreciated by persons of skill in the art, any length could be used for a gap compensation segment, as required by the lithography system.

Figure 6:
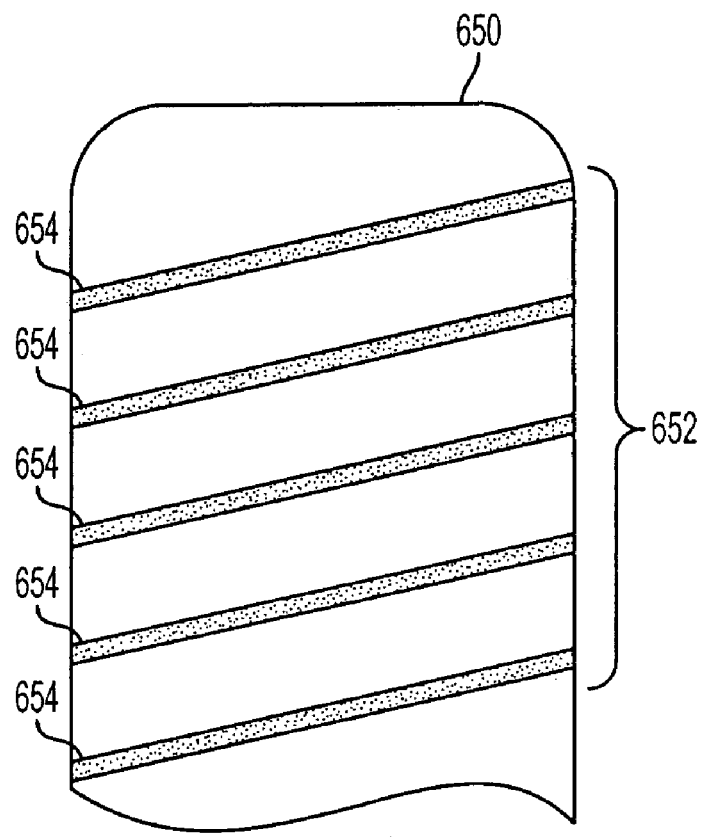
FIG. 6 depicts an exemplary uniformity correction system having a tilted configuration of correction elements 620 and an optical compensation plate 650, according to an embodiment of the present invention.

FIG. 6 depicts an exemplary portion of a uniformity correction system having a tilted configuration of correction elements and an optical compensation plate 650, according to an embodiment of the present invention. Optical compensation plate 650 includes a pattern 652. Because the correction elements are opposed in this embodiment, pattern 652 includes a plurality of parallel gap compensation segments 654 that extend across the optical compensation plate 650.

Figure 7:
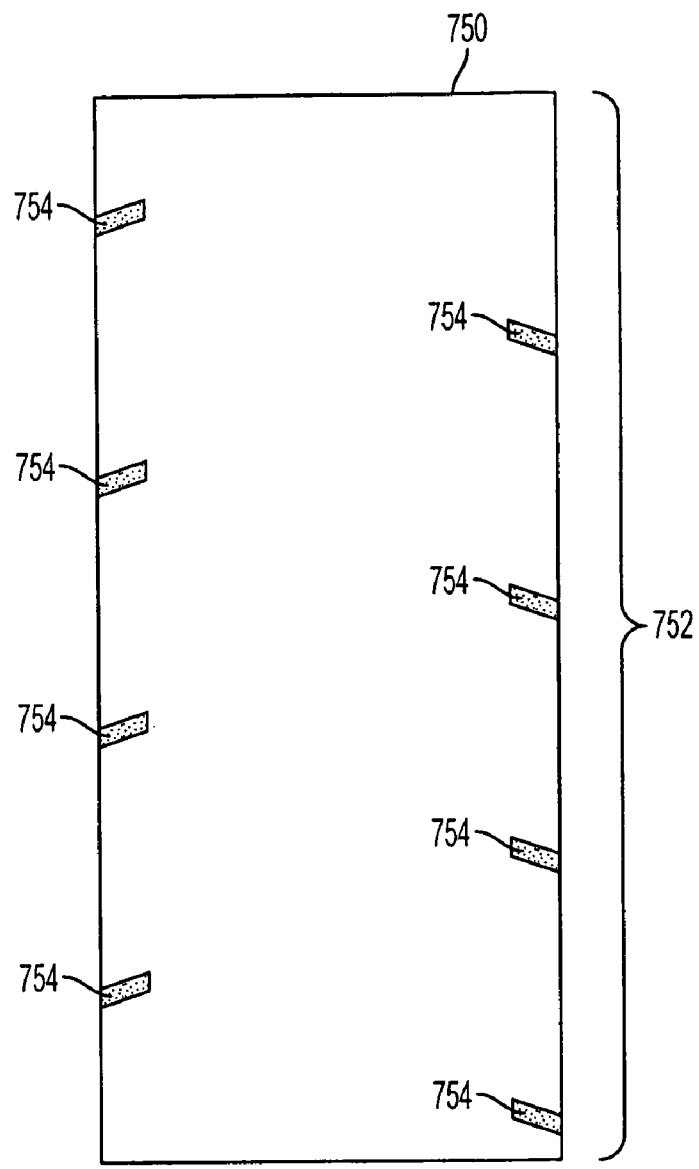
FIG. 7 depicts an exemplary optical compensation plate, according to an embodiment of the present invention.

FIG. 7 depicts an exemplary optical compensation plate 750, according to an embodiment of the present invention. Optical compensation plate 750 includes a pattern 752 having a plurality of gap compensation segments 754. In this embodiment, the gap compensation segments 754 do not extend across the optical compensation plate and in fact do not extend to the center of the optical compensation plate. Thus, in this embodiment, the length of each gap compensation segment is less than width of the optical compensation plate and less than the maximum insertion depth of the correction elements.

Although FIGS. 5–7 describe the pattern on optical compensation plate with respect to the tilted and chevron configuration of correction elements, the present invention can be used with any configuration of correction elements having a gap between adjacent correction elements. In general, the pattern on the optical compensation plate corresponds to the gap between adjacent correction elements. The location of the gap compensation segments on the plate can be associated with the location of the gaps. For example, a center axis for each gap can be defined by the intersection of a first plane coincident with the center of the gap with a second plane including the adjacent correction members which define the gap. The first plane is perpendicular to the second plane. The center axis of each gap compensation segment is then approximately coincident with the line defined by the intersection of the first plane and the optical compensation plate.

3. CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A uniformity correction system comprising:
  a plurality of correction members wherein each correction member is separated from an adjacent correction member by a gap; and
  an optical compensation plate parallel to the plurality of correction members,
  wherein the optical compensation plate includes a pattern having an attenuation, the pattern including a plurality of gap compensation segments, each gap compensation segment corresponding to one of the gaps between adjacent correction members, and
  wherein a location of each gap compensation segment on the optical compensation plate substantially corresponds to the location of the corresponding gap between adjacent correction members in the illumination slot.

2. The uniformity correction system of claim 1, wherein the width of each gap compensation segment is dependent upon the angle of the light incident on the uniformity correction system.

3. The uniformity correction system of claim 1, wherein the width of each gap compensation segment is greater than the width of the gap corresponding to the gap compensation segment.

4. The uniformity correction system of claim 1, wherein each gap compensation segment extends from a first side of the optical compensation plate to a second side of the optical compensation plate.

5. The uniformity correction system of claim 1, wherein the attenuation of the pattern is greater than an attenuation of the optical compensation plate.

6. The uniformity correction system of claim 1, wherein the optical compensation plate has a first surface and a second surface and wherein the pattern is on the first surface.

7. The uniformity correction system of claim 1, wherein the optical compensation plate has a first surface and a second surface and wherein the pattern is on the second surface.

8. The uniformity correction system of claim 1, wherein the optical compensation plate is placed beneath the plurality of correction members.

9. The uniformity correction system of claim 1, wherein the optical compensation plate is placed above the plurality of correction members.

10. The uniformity correction system of claim 1, wherein a first plurality of the plurality of correction members is located on a first side of the first plane and a second plurality of correction members is located on a second side of the first plane,
  wherein the illumination slot is defined by a first direction axis and a second direction axis,
  and wherein the first plurality of correction members is inserted at a first angle with respect to the first direction axis and the second plurality of correction members is inserted at a second angle with respect to the second direction axis.

11. The uniformity correction system of claim 10, wherein the optical compensation plate has a third direction axis and a fourth direction axis, the third direction axis equivalent to the first direction axis of the illumination slot and the fourth direction axis equivalent to the second direction axis of the illumination slot, and
  wherein a first plurality of gap compensation segments is at the first angle with respect to the third direction axis and a second plurality of gap compensation segments is at the second angle with respect to the fourth direction axis.

12. A uniformity correction system comprising:
  a plurality of correction members, movable within a correction slot, wherein each correction member is separated from an adjacent correction member by a gap and wherein each correction member has a first surface in a first plane; and
  an optical compensation plate parallel to the first plane,
  wherein the optical compensation plate includes a pattern having an attenuation, the pattern including a plurality of gap compensation segments, each gap compensation segment corresponding to one of the gaps between adjacent correction members,
  wherein for each gap between adjacent correction members, a center axis of the gap is defined by the intersection of a second plane with the first plane and the center axis of the gap compensation segment corresponding to the gap is approximately coincident with the line defined by the intersection of the second plane and the optical compensation plate.

13. The uniformity correction system of claim 12, wherein the width of each gap compensation segment is dependent upon the angle of the light incident on the uniformity correction system.

14. The uniformity correction system of claim 12, wherein the width of each gap compensation segment is greater than the width of the gap corresponding to the gap compensation segment.

15. The uniformity correction system of claim 12, wherein each gap compensation segment extends from a first side of the optical compensation plate to a second side of the optical compensation plate.

16. The uniformity correction system of claim 12, wherein the attenuation of the pattern is greater than an attenuation of the optical compensation plate.

17. A uniformity correction system comprising:
  a plurality of correction members, movable within an illumination slot, wherein each correction member is separated from an adjacent correction member by a gap; and
  an optical compensation plate,
  wherein the optical compensation plate includes a pattern having an attenuation, the pattern having a plurality of pattern segments, and wherein the arrangement of the pattern on the optical compensation plate corresponds to the arrangement of the gaps between adjacent correction members when each correction member is inserted to a maximum depth in the illumination slot.

18. The uniformity correction system of claim 17, wherein the attenuation of the pattern is greater than an attenuation of the optical compensation plate.

19. The uniformity correction system of claim 17, wherein the optical compensation plate is placed beneath the plurality of correction members.

20. The uniformity correction system of claim 17, wherein the optical compensation plate is placed above the plurality of correction members.

* * * * *